US007349242B2

(12) United States Patent
Den

(10) Patent No.: US 7,349,242 B2
(45) Date of Patent: Mar. 25, 2008

(54) MAGNETIC DEVICE

(75) Inventor: Tohru Den, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 10/968,902

(22) Filed: Oct. 21, 2004

(65) Prior Publication Data

US 2005/0052900 A1 Mar. 10, 2005

Related U.S. Application Data

(62) Division of application No. 09/940,575, filed on Aug. 29, 2001, now Pat. No. 6,829,159.

(30) Foreign Application Priority Data

Aug. 31, 2000 (JP) ............................ 2000-263394

(51) Int. Cl.
*G11C 11/00* (2006.01)
*G11C 11/14* (2006.01)
*G11C 11/15* (2006.01)

(52) U.S. Cl. ........................ 365/158; 365/171; 365/173

(58) Field of Classification Search ................ 365/158, 365/171, 173, 159, 129
See application file for complete search history.

(56) References Cited

U.S. PATENT DOCUMENTS 5,155,093 A 10/1992 Den et al. ...................... 505/1
5,541,868 A 7/1996 Prinz ........................... 365/98
5,764,567 A 6/1998 Parkin ........................ 365/173
6,139,713 A 10/2000 Masuda et al. ............. 205/206
6,172,902 B1 1/2001 Wegrowe et al. ........... 365/158
6,278,231 B1 8/2001 Iwasaki et al. ............. 313/310

(Continued)

FOREIGN PATENT DOCUMENTS

JP 10-1900090 7/1998

(Continued)

OTHER PUBLICATIONS

Furneaux, et al., "The Formation of Controlled-Porosity Membranes from Anodically Oxidized Aluminium," Nature, International Weekly Journal of Science, vol. 337, No. 6203, pp. 147-149, Jan. 12, 1989.

(Continued)

*Primary Examiner*—Shouxiang Hu
(74) *Attorney, Agent, or Firm*—Fitzpatrick, Cella, Harper & Scinto

(57) ABSTRACT

A magnetic device has a layer containing fine pores and having wirings on both faces of the layer formed on a substrate, wherein at least a part of the pores are filled with a layered column formed by stacking magnetic layers and nonmagnetic layers alternately, and at least a part of the pores filled with a conductive column as writing wires for writing into the magnetic layers in the adjacent pores. The fine pores may be nano-holes of alumina formed by anodic oxidation. A part of the pores may serve to intercept a magnetic field. The magnetic layer may contain Co, and the nonmagnetic layer and/or the writing wire may contain Cu. The pores may be arranged in a honeycomb arrangement or a rectangular array. The ratio of the sectional area S ($cm^2$) of the pore and the length (cm) of the pore satisfy the relation: $10^5$<L/S>$10^5$.

4 Claims, 6 Drawing Sheets

U.S. PATENT DOCUMENTS

| | | | | |
|---|---|---|---|---|
| 6,611,034 | B2 | 8/2003 | Den | 257/421 |
| 2002/0054461 | A1* | 5/2002 | Fujiwara et al. | 360/324.1 |

FOREIGN PATENT DOCUMENTS

| | | |
|---|---|---|
| JP | 10-283618 | 10/1998 |
| JP | 11-224422 | 8/1999 |
| JP | 2000-31462 | 1/2000 |

OTHER PUBLICATIONS

Masuda, et al., "Fabrication of Gold Nanodot Array Using Anodic Porous Alumina as an Evaporation Mask," Japanese Journal of Applied Physics, vol. 35, Part 2, No. 1B, pp. L126-L129, Jan. 15, 1996.

Masuda, Solid State Physics, vol. 32, No. 5, pp. 493-499 (1996).

* cited by examiner

MAGNETIC DEVICE

This application is a divisional of U.S. patent application Ser. No. 09/940,575, filed Aug. 29, 2001, now U.S. Pat. No. 6,829,159 the contents of which are incorporated by reference herein.

BACKGROUND OF THE INVENTION

1. Field of the Invention

The present invention relates to a magnetic device. The magnetic device of the present invention is useful in variety of applications such as magnetic memories, magnetic sensors, spin calculation devices, and so forth. In particular, the magnetic device of the present invention is useful as a part of solid magnetic memory devices.

2. Related Background Art

Conventionally, DRAMs, SRAMs, flash memories, EEPROMs, FeRAMs (or FRAMs) are used as the solid memory device. In recent years, magnetic solid memories, especially memories utilizing a TMR effect or a GMR effect, are attracting attention and are being investigated. Therefore, the solid magnetic memory which is relevant to the present invention is explained below.

(Giant Magnetoresistance (GMR))

Firstly the giant magnetoresistance relevant to the present invention is briefly explained. In 1986-1988, Fert et al., and Grunberg et al. found a magnetoresistance much higher than the known AMR in a ferromagnetic (Fe)/nonmagnetic (Cr) artificial lattice, and named this “giant magnetoresistance”. The GMR exhibits characteristically a negative resistivity change rate of as much as several-ten %.

The mechanism of the GMR is understood qualitatively as below. In an artificial lattice, in the absence of a magnetic field, the magnetic layers are arranged antiferromagnetically (interlayer antiferromagnetism). On application of a magnetic field, the magnetization of the layers are parallelized. In this process, the electric resistance is decreased by a spin-depending mechanism in which conduction electrons are remarkably scattered in an antiparallel magnetization state and weakly scattered in a parallel magnetization state.

The interlayer antiparallel magnetization is theoretically studied by employing an RKKY type long-distance exchange interaction or a quantum well model. The spin-dependent scattering between the layers is discussed on the basis of a two-fluid model of the conduction electrons.

The GMR effect can be utilized for a device such as a memory device. In such a device, the magnetization direction of a part of the magnetic layers is fixed, and the magnetization direction of other layers is made changeable for memorization. The device of such a constitution is called a spin-valve type device. The layer fixed in a magnetization direction (the high coercivity layer) is called a hard layer; the layer changeable in the magnetization direction (the low coercivity layer) is called a free layer. Conversely, information is recorded in the hard layers, and the magnetization state (memory state) is read by the resistivity change of the free layer on reversal of the magnetic field.

As the types of the GMR, there are known CIP types, CPP types, and hybrid types thereof such as CAP types, and granular alloy types. Generally, CIP structure is widely studied owing to the ease of the production. However, the CIP type device, in which the current flows in parallel to the lamination interface, is capable of changing its resistivity in the range of about 40 to 50% owing to the conduction electrons not contributing the interface spin scattering.

On the other hand, the CCP type device, in which the current flows perpendicularly to the lamination interface, is capable of changing more remarkably the resistivity, sometimes exceeding 100%, since all electrons are exposed spin scattering corresponding to the spin state of the electrons and the Fermi velocity is increased by the energy gap resulting from the lamination structure. Therefore, the CCP type device has better characteristics basically. However, the CCP type device, in which the current is allowed to flow perpendicularly to the film face, can have an extremely low resistance, which requires extremely small sectional area.

In the case where cell itself is thin like the TMR cell described later, the writing can be conducted effectively by two upper and lower wires. However, in a CPP type GMR cell, particularly a cell in which lamination direction is perpendicular to the substrate, the upper and lower wiring causes difference in the magnetic field intensity between the outer lamination layer portions and the inner layer portion, which may retard effective writing. In other words, the magnetic field is weak in the inner portion of the lamination cell, so that the writing may be hindered in the inner portion of the lamination layers, or an intense writing current may cause writing in a non-selected cell portion, disadvantageously.

In one method to solve this problem, an electric current is allowed to flow through the CPP cell to form a rotational magnetization by the self-magnetic field generated by the electric current. This method is applicable to somewhat larger cells, and may cause disturbance of the magnetization by the reading current, disadvantageously.

(Tunnel magnetic memory (TMR))

Memory cells utilizing a tunnel junction are generally of a spin-valve type as disclosed in Japanese Patent Application Laid-Open No. 10-190090. Such a memory device is explained by reference to FIG. 6.

In FIG. 6, memory cell 61 has a built-up layer structure constituted of a pin layer, an insulation layer, a memory layer, and so forth. The numeral 62 indicates a B-wire; 63, a G-wire; 64, a W-wire; 65, a MOSFET; and 66, a pass transistor. The magnetization in the magnetic layer is usually directed to one of the longitudinal axes.

The tunneling current is more intense and the cell resistivity is lower when two magnetic layers holding an insulation layer therebetween are magnetized in the same direction, whereas the tunneling current is weaker and the cell resistivity is higher when two magnetic layers holding an insulation layer are magnetized in opposite directions.

Usually, the magnetization direction is fixed in one of the two magnetic layers (a hard layer), and is changeable in the other magnetic layer (a free layer). The magnetization direction of the free layer is controlled and maintained by the magnetic field generated by the current flowing through the B-wire and/or the W-wire. That is, the writing is conducted only into the selected cells by a vector sum of the magnetic field generated by the B-wire and the magnetic field generated by the W-wire.

Read-out is conducted by the B-wire and the G-wire. The selection of the cell is made by a MOSFET connected to the G-wire.

The resistivity change rate of the TMR type material can be increased unlimitedly in calculation. However, the actually realizable level is about 40 to 60%. In production thereof, the most important problem in production and the characteristics of the device is a production method of the insulation layer and the bias dependency of the resistivity change rate. The insulation layer should be formed uniformly in a thickness of 1 nm, which is not easy in the practical device production. Furthermore, the bias dependency may become a problem by which the resistivity change rate drops remarkably at a higher voltage. These problems do not arise in the aforementioned GMR device.

The CPP type GMR structure employed in the present invention requires fine pores (minute through-holes) of higher aspect ratio. This structure can be obtained by a membrane filter prepared by track-etching, or by anodic oxidized alumina. The most suitable anodic oxidized film is explained below in detail.

(Anodic Oxidized Alumina)

An anodic oxidized alumina layer, a porous type anodic oxidation film, can be formed by anodic oxidation of an Al plate in an acidic electrolytic solution such as sulfuric acid, oxalic acid, and phosphoric acid. (See, for example, R. C. Furneaux, W. R. Rigby, and A. P. Davidson: NATURE, Vol. 337, p. 147 (1989), etc.) This porous film is characterized by a specific geometrical structure in which extremely fine cylindrical fine pores (nano-holes) 11 having a diameter of several nm to several-hundred nm are arranged in parallel at intervals of several-ten nm to several-hundred nm. The cylindrical fine pores has a high aspect ratio and sufficient uniformity in the sectional diameter.

The structure of the porous film can be controlled to some extent by the anodic oxidation conditions. It is known, for example, that the pore spacing can be changed to some extent by anodic oxidation voltage; the pore depth by anodic oxidation time; and the pore diameter by a pore-widening treatment. The pore-widening treatment is an alumina etching treatment, usually a wet etching with phosphoric acid.

For improvement of the fine pores of the porous film in the verticality, linearity, and independency, a two-step anodic oxidation is disclosed (Japanese Journal of Applied Physics, Vol. 35, Part 2, No. 1B, pp. L126-L129, 15 Jan., 1996). In this method, a porous coating film formed by anodic oxidation is once removed, and then anodic oxidation is conducted again to obtain a porous film having pores excellent in the verticality, linearity, and independency. This method utilizes the surface indents on the Al plate left after removal of the anodic oxidation film formed by the first anodic oxidation, in the second anodic oxidation, as the pore-formation initiation points in the second anodic oxidation.

Further, for improvement of control of the shape, spacing intervals and arrangement pattern of the fine pores in the porous film, a method is disclosed (Nakao: U.S. Pat. No. 6,139,713; and Masuda: Kotai Buturi (Solid Physics) 31, 493 (1996), in which pore initiation points are formed by using a stamper. In this method, a plate having plural projections on the surface is pressed against the surface of the Al plate to form dents thereon as the pore-formation initiation points, and the Al plate is anodized to form a porous film having pores with the shape, spacings, and pattern controlled sufficiently.

Instead of the honeycomb arrangement, the fine pores can be arranged concentrically (Ohkubo: Japanese Patent Application Laid-Open No. 11-224422). Besides the stamping process, the initiation points can be prepared by an FIB process (Focused ion beam process), and a photolithography.

Japanese Patent Application Laid-Open No. 10-283618 discloses a process of embedding a built-up magnetic layer having GMR properties into the aforementioned anodic oxidation alumina nano-holes. This disclosure describes the wiring on the pore surface for magnetic writing into the built-up magnetic material. However, the writing into fine pores of high aspect ratio has not been solved yet.

The aforementioned usual TMR type memory elements require a large amount of electric current for the writing, and the devices consume a large amount of power. Further, nonuniformity of the memory cells or nonuniformity of the writing wiring can cause erroneous writing into a non-selected cells or writing failure in the selected cells.

In the cells having a larger aspect ratio in the thickness direction, writing is sometimes not effectively conducted by the crossing upper and lower wiring.

SUMMARY OF THE INVENTION

In view of the above disadvantages, an object of the present invention is to provide a magnetic device comprising an effective writing means into a cell of a high aspect ratio.

Another object of the present invention is to provide a magnetic device for writing effectively and uniformly with a small amount of electric current.

A further object of the present invention is to provide a magnetic device in a high density and is easily producible.

The present invention provides a magnetic device having a layer containing fine pores (fine through-holes) and having wiring on both faces of the layer formed on a substrate, wherein at least a part of the pores are filled with a layered column formed by stacking magnetic layers and nonmagnetic layers alternately, and at least a part of the pores serve as writing wires for writing into the magnetic layers in the adjacent pores. As the layer having the pores, effective is an alumina layer formed by anodic oxidation. In this device, a part of the pores are employed preferably for intercepting a magnetic field.

The magnetic layer preferably contains Co as the main constituent, the nonmagnetic layer preferably contains Cu as the main constituent, and the writing wire preferably contains Cu as the main constituent for achieving desired characteristics and production of the device.

Preferably in the magnetic device, the pores are arranged in a honeycomb pattern, and the pores filled with the layered column surround the writing wire pore; or conversely the writing wire pores surround the pore filled with the layered column. Similarly, a magnetic device is preferred in which the pores are arranged in a rectangular array, and the pores filled with the layered column surround the writing wire pore; or conversely the writing wire pores surround the pore filled with the layered column.

In the magnetic device, for effective nonvolatile switching function like a memory, the ratio of the sectional area S ($cm^2$) of the pore and the length L (cm) of the pore preferably satisfv the relation:

$$10^5 < L/S < 10^8 \text{(omitted)}$$

DETAILED DESCRIPTION OF THE PREFERRED EMBODIMENTS

Figure 1A:
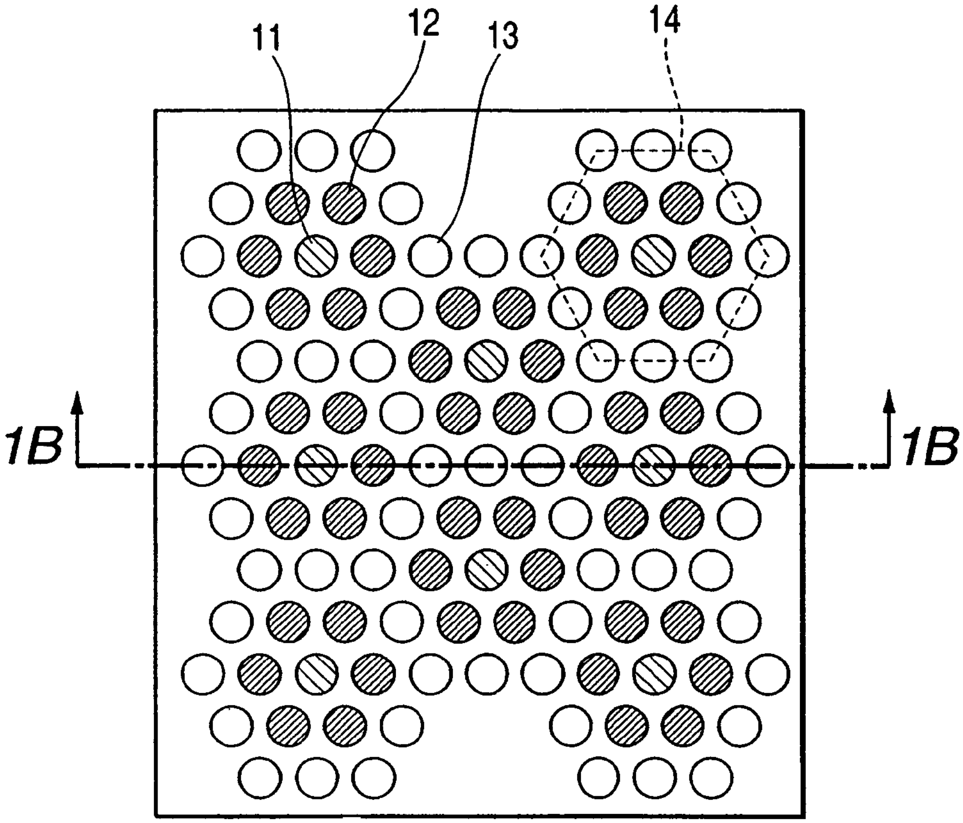
FIGS. 1A and 1B are simplified drawings of a magnetic device of the present invention having a honeycomb arrangement.
Figure 1B:
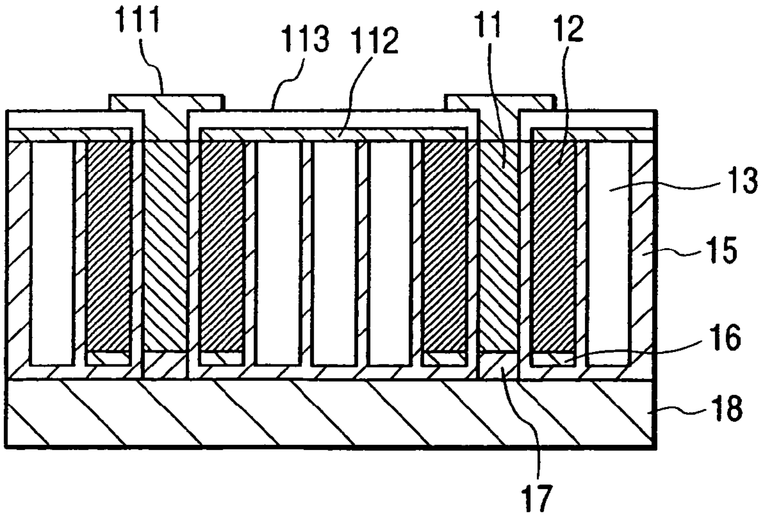
Figure 2A:
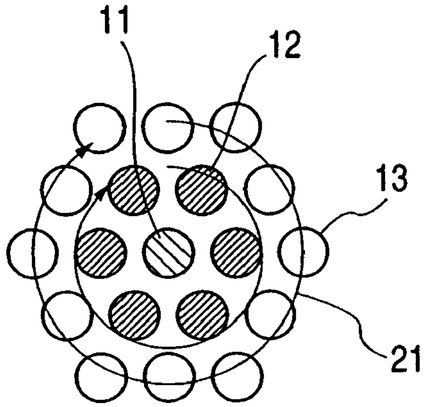
FIGS. 2A, 2B and 2C are simplified drawings illustrating a function of writing wiring of the present invention.
Figure 2B:
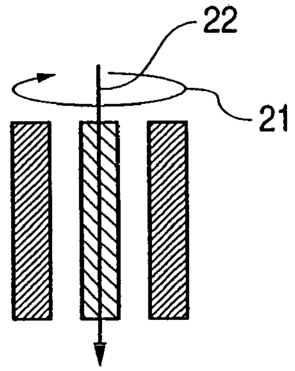
Figure 2C:
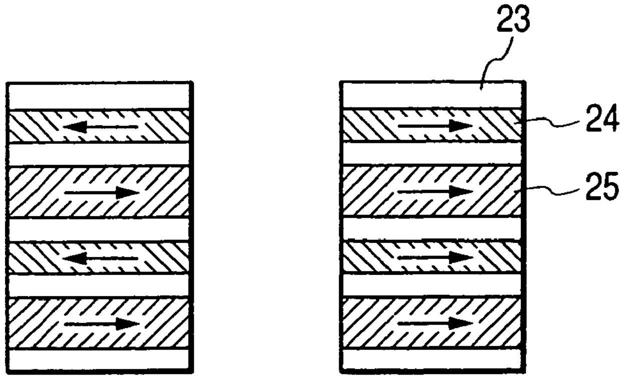

The effects of the present invention are explained by reference to FIGS. 1A and 1B, and FIGS. 2A, 2B, and 2C. FIGS. 1A and 1B are simplified drawings of a device constitution employing pores in a honeycomb arrangement. FIGS. 2A, 2B, and 2C are simplified drawings showing magnetic field generation, and magnetization in the above constitution.

In FIGS. 1A and 1B, and FIGS. 2A to 2C, the numeral 11 denotes a writing pore; 12, a layered magnetic pore; 13, an intercepting pore; 14, a unit cell; 15, a pore-containing layer; 17, a lower writing wire; 18, a substrate; 111, an upper writing wire; 112, an upper reading wire; 113, an insulation layer; 21, a generated magnetic field; 22, a writing current; 23 a non-magnetic layer; 24, a free magnetic layer; and 25. a hard magnetic layer.

In FIGS. 1A and 1B, one cell of the device is represented by unit cell 14 surrounded by the dotted line, constituted of writing pore 11, layered magnetic pores 12, and intercepting pores 13. In these drawings, one writing pore 11 is surrounded by six layered magnetic pores, but is not limited to six layered magnetic pores. Intercepting pores 13 for intercepting the magnetic field between the unit cells may be omitted. However, the intercepting pores should be provided if the writing current can affect the layered magnetic pores of the adjacent memory cell. For effective interception of the magnetic field, the intercepting pores are preferably filled with a soft magnetic material having a high magnetic permeability.

Application of electric current to a writing pore will generate a rotating magnetic field around the writing pore as shown in FIGS. 2A to 2C. At an intensity of this magnetic field exceeding a certain level, a part of the magnetization of the magnetic layer in the layered magnetic pores rotates in the above same direction as the above rotating magnetic field. This change can be made nonvolatile by the design of the layered structure, exhibiting a memory effect. Therefore, by generating a sufficiently intense magnetic field, both the free magnetic layer and the hard magnetic layer are magnetized in the same magnetization direction as shown by the right side drawing in FIG. 2C. In this state, by application of a magnetic field in the reverse direction, only the magnetization in the free magnetic layer is reversed as shown in the left side drawing in FIG. 2C.

This change of magnetization will cause change of the resistivity of the layered magnetic pore by a GMR or a spin-valve effect. Therefore, the memory state can be detected by reading the resistance of the cell. This reading is conducted by application of an electric current to the layered magnetic pores. The reading can be conducted without destroying the memory state by application of a reading current of sufficiently lower level than the writing current level.

The writing pore should be electroconductive, and may naturally be filled with the layered material. However, in consideration of heat generation, electromigration, and other problems, the writing pore is preferably filled with a low-resistance metal like copper. The layered column in memory pore is not limited, provided that it has GMR characteristics or spin-valve characteristics. For forming a layered column in the pores of a high aspect ratio, an electrodeposition process is suitable. Copper and cobalt are suitable as the material for formation of the column by electrodeposition.

For application to magnetic memories and magnetic sensors, the layered columns are preferably formed from two kinds of magnetic materials: a high-coercivity material and a low-coercivity material. The effects for the memory or the sensor can be achieved by employing the high-coercivity magnetic layer as the hard magnetic layer to fix the magnetization and the how-coercivity magnetic layer as the free layer, and controlling the writing by the writing electric current.

Figure 3A:
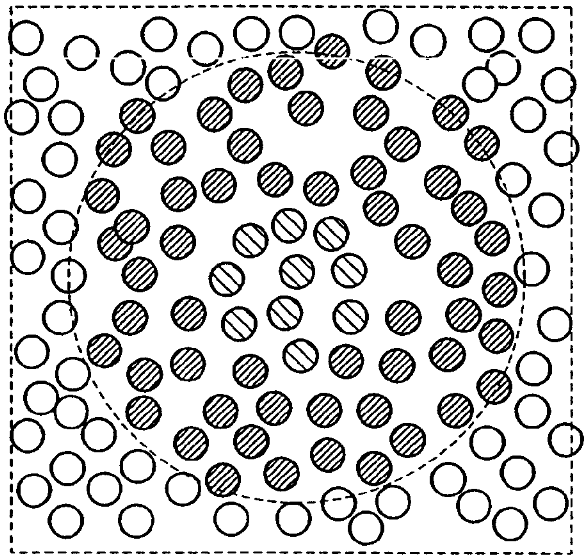
FIGS. 3A, 3B and 3C are conceptional drawings of the magnetic device of the present invention having a random arrangement, a square arrangement, or a rectangular arrangement.
Figure 3B:
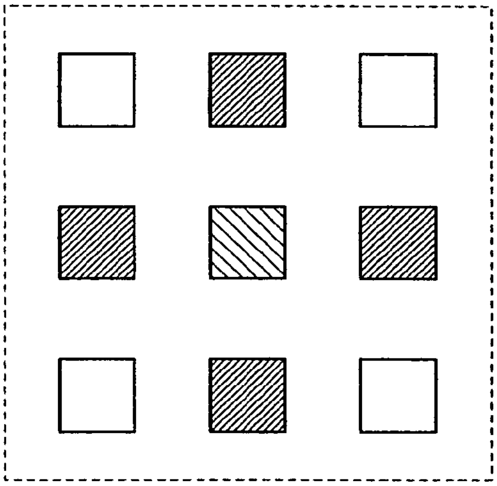
Figure 3C:
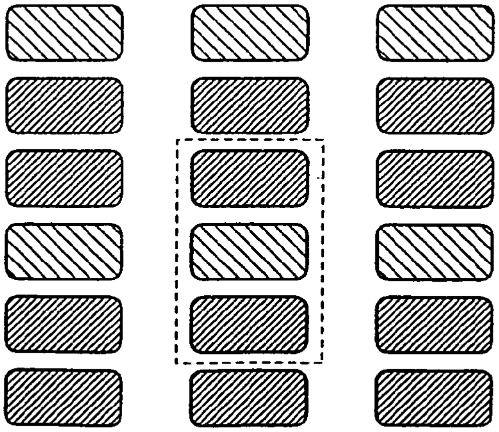

Next, the fine pore arrangement is explained. The pore arrangement is not limited to the honeycomb arrangement as shown in FIGS. 1A and 1B. For example, a random arrangement as shown in FIG. 3A may be employed by employing several pores as the writing wires and plural pores adjacent to the writing pores as the layered magnetic pores. A square arrangement which is a special case of rectangular arrangement is illustrated in FIG. 3B, and a rectangular arrangement is illustrated in FIG. 3C.

Figure 4A:
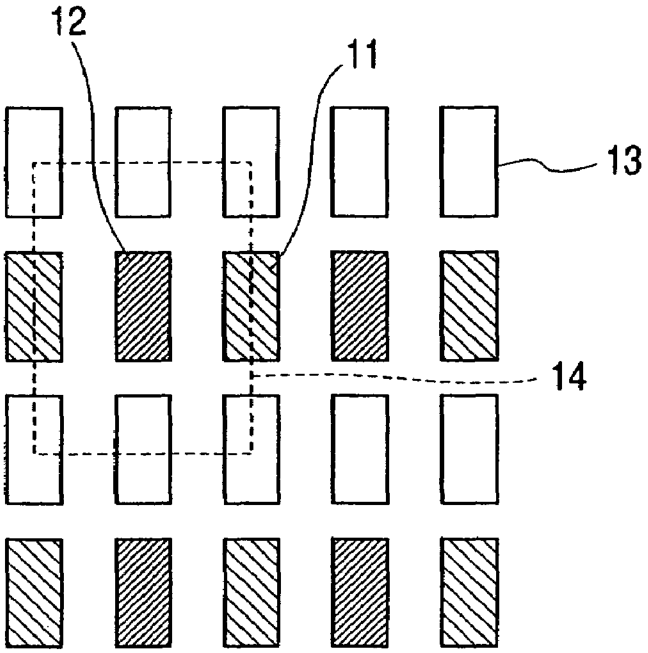
FIGS. 4A and 4B are wiring drawings for writing in the rectangular arrangement of the present invention.
Figure 4B:
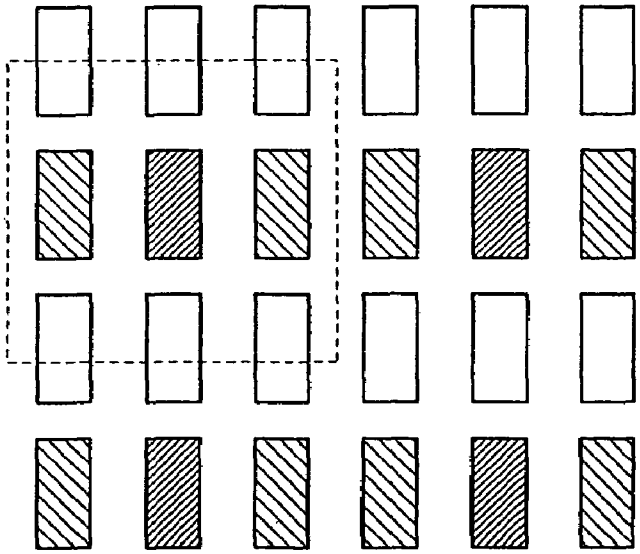

Arrangements other than those shown in FIGS. 1A and 1B, and FIGS. 3A to 3C may be applicable. For example, between two or more writing pores, layered magnetic pores are arranged as shown in FIGS. 4A and 4B. In this case, however, the electric current should be allowed to flow in opposite direction in the writing wires at the right side and the left side of the layered magnetic pore.

In FIG. 4B, the writing wire is employed for writing into a layered magnetic pore only in one unit cell 14. However, the writing wire may be employed for writing into layered magnetic pores in plural unit cells as shown in FIG. 4A. In the honeycomb arrangement of pores, when the layered magnetic pore is placed at the center, writing pores are placed around the center, and an electric current is applied to the writing pores in the same direction, a rotational magnetization can be generated in the layered magnetic pores. This rotational magnetization also can be useful for decreasing the diamagnetic field.

The pore is explained below. The pores have a diameter ranging from several-ten nm to several-hundred nm with an aspect ratio of not less than 5, preferably not less than 50. The pores can be prepared by a semiconductor process. However, an anodically oxidized porous film of aluminum (anodic oxidized alumina nano-hole) is preferred for formation of pores of a larger aspect ratio and less change of the diameter in thickness direction.

As the material for the anodic oxidized layer, Al is generally used. The material may contain another element provided that film is mainly constituted of Al and can be anodically oxidizable. The Al film can be formed by vacuum vapor deposition by resistance heating, sputtering, CVD, and so forth. The formed film should have a flat surface.

-Applications-

This magnetic device is useful as a memory cell, a magnetic switching device, a signal detector of a magnetic calculation device, and so forth. In application of the present invention to a switching device for a magnetic memory, the ratio of the sectional area S ($cm^2$) of the pore and the length L (cm) of the pore preferably satisfy the relation:

$$10^5 < L/S < 10^8$$

Since the magnetic material in the layered magnetic pores has a resistivity ranging from several to several-ten μΩcm, the resistance of the cell satisfying the above relation is in the range of several Ω to several kΩ, which is convenient for reading-out.

EXAMPLES

The present invention is described more specifically by reference to examples.

Example 1

An example of a honeycomb-arranged pores employed for memory cells and writing wire is explained by reference to drawings. FIGS. 5A, 5B, 5C, 5D, 5E, and 5F are sectional views showing a precess for preparing a pore arrangement.

Figure 5A:
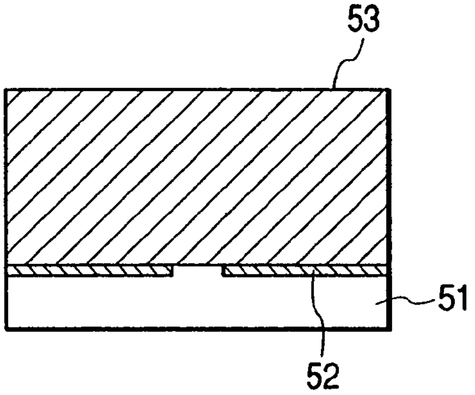
FIGS. 5A, 5B, 5C, 5D, 5E and 5F illustrate the production processes of production of a magnetic device of the present invention.
Figure 5B:
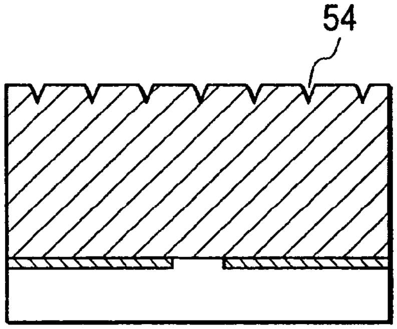
Figure 5C:
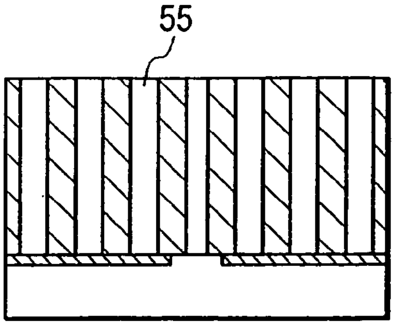

A copper film was formed on substrate 51 for lower wiring 52. The copper film was patterned. Thereon, aluminum layer 53 was formed in a thickness of about 1 μm. On the upper face of the aluminum layer, dents were formed at the spots for pore formation by an FIB method as anodic oxidation initiation spots 54. The initiation spots were arranged in a honeycomb arrangement, at the spot intervals of about 250 nm. Then the aluminum film was oxidized by anodic oxidation in 0.3 mol/L phosphoric acid solution at 100 V. Thereby anodized alumina nano-holes 55 were formed on lower wiring 52 as shown in FIG. 5C. The sectional areas of the pores were in the range from 10000 to 30000 $nm^2$ ($S=10000$ to $30000\times10^{-14}$ $cm^2$); the lengths of the pores were in the range from 800 to 1200 nm ($L=800$ to $1200\times10^{-7}$ cm); and L/S was in the range of 0.027 to $0.12\times10^7$.

Figure 5D:
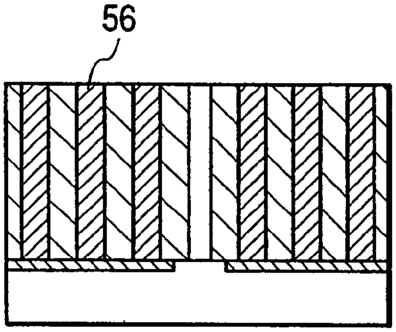
Figure 5E:
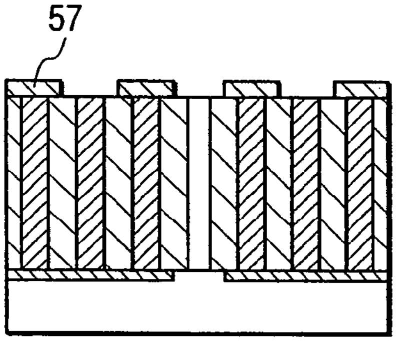
Figure 5F:
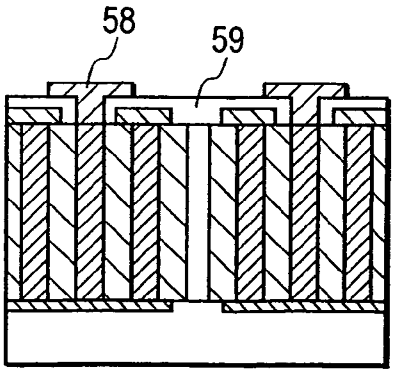
Figure 6:
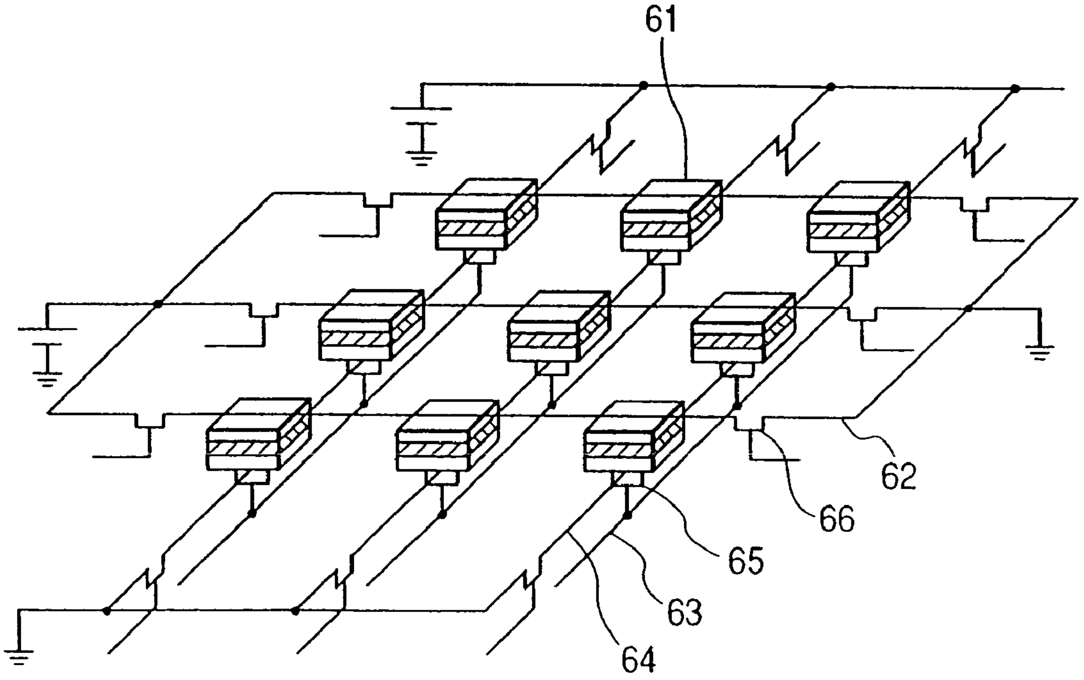
FIG. 6 is a conceptional drawing of a conventional TMR type memory device.

This sample was immersed in an electrolysis solution containing 0.5M cobalt sulfate and 0.001M copper sulfate together with a platinum counter electrode, and thereto a voltage of −0.56 V, −1.2 V, −0.56 V, and −1.2 V for 30 seconds, 0.15 second, 30 seconds, and 0.25 second respectively by employing an Ag—AgCl reference electrode for electrodeposition. This electrodeposition operation was repeated until the layered material reached the pore top to grow the Co/Cu layer. Thus, layered column 56 was prepared as shown in FIG. 5D. In the electrodeposition, the voltage application of −0.56 V allows electrodeposition of only Cu as the noble ion, whereas the voltage application of −1.2 V allows electrodeposition mainly of Co contained at a higher concentration, thereby giving a layered structure. The layered magnetic column were formed only in the pores on the portion where the lower wiring was provided, whereas no electrodeposition was caused in the pores on the portion where the lower wiring layer was not provided. The latter pores were utilized as the intercepting pores.

Upper reading wiring 57 was formed on the top portions of the layered magnetic column except the central layered magnetic pores, and thereon upper writing wiring 58 was formed with interposition of an insulating film 59.

The resistance between the lower wiring and the upper wiring of the present invention was measured in a magnetic field, and was found to have negative magnetoresistance. This is considered to be due to the GMR effect of the filled layered column. The memory effect of the present invention was examined as follows. Firstly, an electric current of 50 mA was applied to bring the device to an initial state between the upper writing electrode and the lower electrode. Then a reverse electric current was applied with gradual increase by measuring the resistance between the underlying electrode and the upper reading electrode. Thereby, the resistance was found to increase at the writing current of −20 mA. Even after shutdown of the writing electric current, the resistance was kept remaining high. This is considered to result from the function of the thick Co layer as a hard magnetic layer and the function of the thin Co layer as a free magnetic layer.

For comparison, an element was prepared which can conduct writing by the upper wiring and the lower wiring in place of the writing pores, and the same measurement was conducted. As the results, the resistance began to increase at the writing electric current of about −30 mA, but the increase was about half the increase in the present invention. This is considered to be nonuniformity in the reversal of the free magnetic layer and the magnetization direction of the hard magnetic layer in the layered magnetic pores of the comparative experiment.

As shown above, the constitution of the present invention enables conducting writing and retaining the memory state. Further, it was found that the constitution of the present invention has excellent GMR characteristics and enables writing with a smaller amount of the electric current.

Example 2

In this Example, various metals were used as the writing wire. The devices were prepared in the same manner as in Example 1 except that the lower writing wiring and the lower reading wiring were separately prepared as shown in FIGS. 1A and 1B. Thereby, of the alumina nano-holes, the filling material in the writing pores and in the layered magnetic pore can be differentiated.

In this Example, in the layered magnetic pores, the magnetic materials Co/Cu for layered column were electrodeposited in the same manner as in Example 1, and in the writing pores, Co, Cu, or Ni was electrodeposited. After preparation of the upper wiring, evaluation was conducted for writing. As the results, the writing electric current was invariably −20 mA respectively, and the power consumption was ⅓ or less for Cu in comparison with that of Co or Ni. This is considered to be due to the low resistance of Cu.

From the results of this Example, Cu is suitable as the wiring material of the writing pores.

Example 3

Square cells and rectangular cells were employed in this Example. The devices were prepared in the same manner as in Example 1, except that the pore-formation initiation points formed by FIB is not in a honeycomb arrangement but in a square arrangement or a rectangular arrangement. In the square arrangement, the intervals between the initiation points were 100 nm; and in the rectangular arrangement, short intervals were 80 nm and the long intervals were 120 nm. The anodic oxidation was conducted at 40 V in a 0.3 mol/L oxalic acid solution.

Further a pore-widening treatment was conducted in 5 wt % phosphoric acid solution for 30 minutes. Thereby, in the square arrangement, the pores were nearly square with the corners slightly rounded; and in the rectangular arrangement, the pores were nearly rectangular with the corners slightly rounded.

In the square arrangement, the sectional areas of the pores were in the range from 2000 to 5000 $nm^2$ ($S=2000$ to $5000\times10^{-14}$ $cm^2$); the lengths of the pores were in the range from 800 to 1200 nm ($L=800$ to $1200\times$cm); and L/S was in the range of 0.16 to $0.6\times10^7$.

In the rectangular arrangement, the sectional areas of the pores were in the range from 2000 to 5000 $nm^2$ ($S=2000$ to $5000\times10^{-14}$ $cm^2$); the lengths of the pores were in the range from 800 to 1200 nm ($L=800$ to $1200\times10^{-7}$ cm); and L/S was in the range of 0.16 to $0.6\times10^{7}$.

In the same manner as in Example 1, a Co/Cu layered column was filled in the pores by electrodeposition, upper wiring was formed, and the devices were evaluated. In the square-arranged device, the writing current was about 20 mA, and in the rectangular-arranged device, the writing current was about 15 mA.

The change of the resistivity between the initial state and writing state in the square/rectangular arrangement in Example 3 is larger by about 10 to 20% than that of the honeycomb arrangement of Example 1. In this respect, the square/rectangular arrangement of Example 3 is better than the honeycomb arrangement of Example 1. On the other hand, the variation between the cells is less in the honeycomb arrangement of Example 1 than in the square/rectangular arrangement of Example 3. In this respect the honeycomb arrangement of Example 1 is better than the square/rectangular arrangement of Example 3.

Example 4

In the device of this Example, a layered magnetic pore is placed between writing pores in a rectangular arrangement as shown in FIG. 4A. The device was prepared in the same manner as in Example 3. Writing was conducted with the underlying wiring grounded, applying a positive voltage to the writing wiring at the left of the layered magnetic pore and a negative voltage to the writing wiring at the right thereof to change the current flow direction at the right side from that at the left side. As the result, the writing could be conducted at an electric current flow intensity as low as 8 mA. The writing into the adjacent cell did not cause change of the resistance, or other adverse effect.

As described above, the writing can be conducted with less intense electric current by placing the writing wire pore between the layered magnetic pores.

What is claimed is:

1. A magnetic device comprising:

a first group and a second group of nanoholes formed in an alumina film through anodic oxidation, each of the first group of nanoholes contains at least alternately stacked magnetic and nonmagnetic layers; and each of the second group of nanoholes contains at least a conductive material forming a non-magnetic nanowire, wherein the first and second groups of nanoholes are arranged in an alternating manner with two of the second group of nanoholes being positioned immediately adjacent to and on opposite sides of one of the first group of nanoholes, and the non-magnetic nanowires in the two of the second group of nanoholes serve together as a writing wire for writing into the magnetic layers in the one of the first group of nanoholes.

2. The magnetic device according to claim 1, wherein the alternately stacked magnetic and nonmagnetic layers comprise a hard magnetic layer and a soft magnetic layer, and the nonmagnetic layer is disposed between the hard magnetic layer and the soft magnetic layer.

3. The magnetic device according claim 1, wherein at least one of the magnetic layers contains Co, and at least one of the nonmagnetic layers contains Cu.

4. The magnetic device according to claim 3, wherein the conductive material contains Cu.

* * * * *

UNITED STATES PATENT AND TRADEMARK OFFICE

CERTIFICATE OF CORRECTION

PATENT NO. : 7,349,242 B2 
APPLICATION NO. : 10/968902
DATED : March 25, 2008
INVENTOR(S) : Tohru Den It is certified that error appears in the above-identified patent and that said Letters Patent is hereby corrected as shown below:

ON THE TITLE PAGE, ITEM [56]:

Foreign Patent Documents, “JP 10-1900090 7/1998” should read -- JP 10-190090 7/1998 --;

Abstract, Line 14, “length (cm)” should read -- length L (cm) --; and

Abstract, Line 15, “$10^5<L/S>10^5$.” should read -- “$10^5<L/S<10^8$. --.

COLUMN 1:

Line 12, “variety” should read -- a variety --.

COLUMN 3:

Line 23, “has” should read -- have --.

COLUMN 4:

Line 7, “a” should be deleted; and

Line 50, “satisfv” should read -- satisfy --.

COLUMN 5:

Line 22, “25.” should read -- 25 --.

COLUMN 6:

Line 11, “how-coercivity” should read -- low-coercivity --.

COLUMN 7:

Line 11, “a” should be deleted; and

Line 45, “were” should read -- was --.

UNITED STATES PATENT AND TRADEMARK OFFICE

CERTIFICATE OF CORRECTION

PATENT NO. : 7,349,242 B2
APPLICATION NO. : 10/968902
DATED : March 25, 2008
INVENTOR(S) : Tohru Den It is certified that error appears in the above-identified patent and that said Letters Patent is hereby corrected as shown below:

COLUMN 8:

Line 63, "1200xcm);" should read -- 1200 x $10^{-7}$cm); --.

Signed and Sealed this

Twenty-second Day of December, 2009

David J. Kappos

*Director of the United States Patent and Trademark Office*